(12) United States Patent
Ikegami

(10) Patent No.: US 7,061,070 B2
(45) Date of Patent: Jun. 13, 2006

(54) SEMICONDUCTOR DEVICE WITH FUSE ARRANGEMENT

(75) Inventor: Hiroshi Ikegami, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 425 days.

(21) Appl. No.: 10/165,982

(22) Filed: Jun. 11, 2002

(65) Prior Publication Data

US 2002/0185706 A1    Dec. 12, 2002

(30) Foreign Application Priority Data

Jun. 12, 2001    (JP) ............................. 2001-177007

(51) Int. Cl.
*H01L 29/00*    (2006.01)

(52) U.S. Cl. ..................... 257/529; 257/209; 257/665

(58) Field of Classification Search ................ 257/529, 257/209, 132, 665, 530; 438/132, 467, 215, 438/281, 333, 601
See application file for complete search history.

(56) References Cited

U.S. PATENT DOCUMENTS

| | | | | | |
|---|---|---|---|---|---|
| 5,608,257 | A | * | 3/1997 | Lee et al. | 257/529 |
| 5,949,323 | A | * | 9/1999 | Huggins et al. | 337/401 |
| 5,986,321 | A | * | 11/1999 | Froehner | 257/529 |
| 6,057,221 | A | * | 5/2000 | Bernstein et al. | 438/601 |
| 6,118,145 | A | * | 9/2000 | Egawa | 257/296 |
| 6,204,548 | B1 | * | 3/2001 | Komai | 257/529 |
| 6,265,778 | B1 | * | 7/2001 | Tottori | 257/758 |
| 6,295,721 | B1 | * | 10/2001 | Tsai | 29/623 |
| 6,303,970 | B1 | * | 10/2001 | Lee et al. | 257/529 |
| 6,333,545 | B1 | * | 12/2001 | Ema | 257/529 |
| 6,333,876 | B1 | * | 12/2001 | Kawasaki et al. | 365/200 |
| 6,376,894 | B1 | | 4/2002 | Ikegami et al. | |
| 6,404,035 | B1 | * | 6/2002 | Wu | 257/529 |
| 6,440,834 | B1 | * | 8/2002 | Daubenspeck et al. | 438/601 |
| 6,633,055 | B1 | * | 10/2003 | Bertin et al. | 257/173 |
| 6,649,997 | B1 | * | 11/2003 | Koike | 257/529 |
| 6,876,057 | B1 | * | 4/2005 | Watanabe | 257/529 |
| 2005/0006718 | A1 | * | 1/2005 | Hanji et al. | 257/529 |

FOREIGN PATENT DOCUMENTS

| | | |
|---|---|---|
| JP | 10-163331 | 6/1998 |
| JP | 11-340434 | 12/1999 |
| JP | 11340434 A * | 12/1999 |
| JP | 2000-114382 | 4/2000 |
| JP | 2000-243845 | 9/2000 |

* cited by examiner

*Primary Examiner*—Eugene Lee
(74) *Attorney, Agent, or Firm*—Finnegan, Henderson, Farabow, Garrett & Dunner, L.L.P.

(57) ABSTRACT

A semiconductor device is disclosed, which comprises a semiconductor substrate, an interlayer insulation film formed above the semiconductor substrate, a fuse formed on or in the interlayer insulation film, and a wiring layer formed in a portion of the interlayer insulation film, which is under the fuse, the wiring layer being isolated from the fuse and having a width smaller than the fuse.

14 Claims, 9 Drawing Sheets

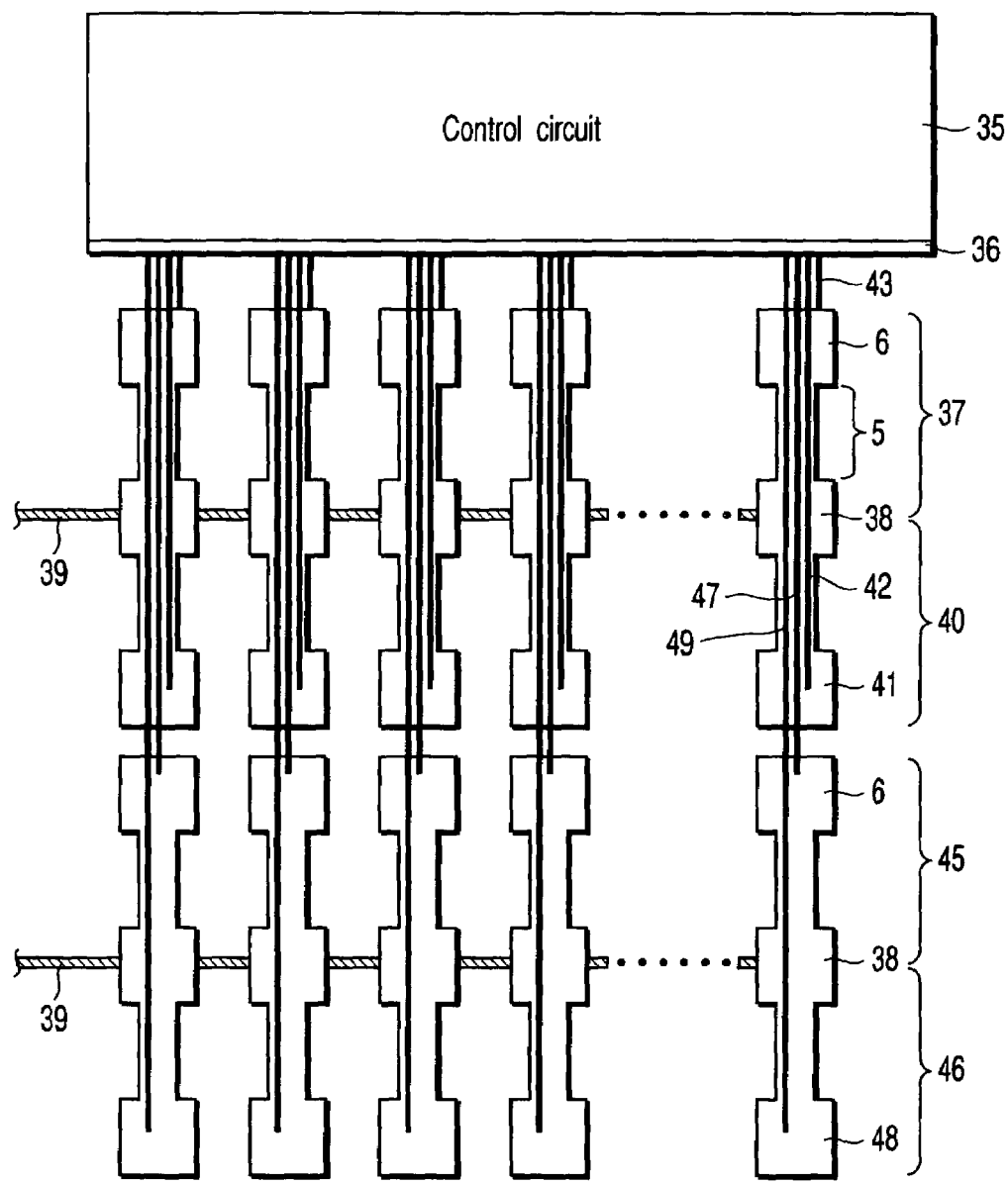
F I G. 12

SEMICONDUCTOR DEVICE WITH FUSE ARRANGEMENT

CROSS-REFERENCE TO RELATED APPLICATIONS

This application is based upon and claims the benefit of priority from the prior Japanese Patent Application No. 2001-177007, filed Jun. 12, 2001, the entire contents of which are incorporated herein by reference.

BACKGROUND OF THE INVENTION

1. Field of the Invention

The present invention relates to an integrated semiconductor device, and in particular, to a semiconductor device with fuses which are used for a redundancy circuit.

2. Description of the Related Art

In recent years, high integration of integrated semiconductor circuits has advanced, and with respect to DRAMs in particular, high-integration of the gigabit level is required in the field of art. In semiconductor memories such as DRAMs, a redundancy technique has been used, and a fuse cutting method by laser radiation has been used to replace a defective cell with a space cell by the redundancy technique. As high integration of semiconductor devices has progressed, large scaling of the number of fuses has progressed. A technique for reducing the surface area occupied by the fuses has become necessary, since the large scaling of the number of fuses results in an increase of the surface area on a semiconductor chip occupied by the fuses, accordingly.

A conventional fuse arrangement form is shown in FIG. 15 in a cross sectional view. An interlayer insulation film 51 is formed on a semiconductor substrate 50, and a plurality of fuses 52 (in FIG. 15, three fuses are shown) are formed in a surface-extension direction of the substrate 50 in an upper layer region of the interlayer insulation film 51. However, as shown in FIG. 15, no wiring, elements, etc., are formed in a layer region of the interlayer insulation film 51, which is lower than the upper layer region in which the fuses 52 are formed. If wiring, elements, etc., can be formed in the lower layer region of the interlayer insulation film 51, an increase in the occupied surface area can be suppressed by an amount corresponding to the wiring, elements, etc., and therefore, the increase of the occupied surface area due to the large scaling of the number of fuses can be absorbed. However, in the conventional fuse arrangement form, wiring, elements, etc., cannot be formed in the lower layer region of the interlayer insulation film 51. The reasons for this are given hereinafter.

A laser used for cutting a redundancy fuse is an infrared laser having a wavelength of 1321 nm or 1047 nm, and hence the laser passes through the interlayer insulation film, and concretely, through the interlayer insulation film at the periphery of a fuse. The light absorption coefficient of silicon, which is used for a semiconductor substrate as the backside layer of the interlayer insulation film, is extremely small compared with the light absorption coefficient of the fuse. Hence, at the time of cutting the fuse by laser beam, even if the laser beam passes through the interlayer insulation film and reaches the silicon substrate, the silicon is not damaged.

However, if a material layer such as metal wiring, a polysilicon layer or the like having an absorption coefficient of the same level as the fuse is provided in the lower layer region of the interlayer insulation film 51, which is lower than the upper layer region in which the fuses are formed, the laser beam which has passed through the interlayer insulation film is radiated onto the material layer in the lower layer region, and the material layer is damaged. Namely, the fuse cannot be cut without the material layer in the lower layer region being damaged.

As a technique of attempting to form a metal wire or a polysilicon layer in the lower layer region of the insulation film, as disclosed in Jpn. Pat. Appln. KOKAI Publication No. 2000-243845, there is a technique of forming a laser absorbing layer on the entire surface of an insulation film in which the fuses are formed. However, with this technique, it is necessary to cut the laser absorbing layer and the fuse simultaneously by laser radiation, and thus, it is also necessary to radiate a high energy laser beam. Since a high energy laser radiation increases the damage to the region adjacent to the fuse to be cut, the fuse pitch must be made large. Thus, the surface area occupied by the fuses increases.

Further, as disclosed in Jpn. Pat. Appln. KOKAI Publication No. 11-340434, a method has been proposed in which, by forming a laser absorbing layer in the lower layer region of the insulation film in which the fuses are formed, passage of the laser beam through the laser absorbing layer is cut off by the laser absorption by the laser absorbing layer, and wirings or elements provided lower than the laser absorbing layer are protected from being damaged. However, with this technique, there is the need for selectability such that only the fuses are cut and radiation damage is not caused to the laser absorbing film. However, even when the laser absorbing film is a refractory metal film such as W, Ti, Ta or the like, the energy margin for cutting only the fuses without causing damage to the laser absorbing film is small. As a result, a problem arises in that the yield is not improved.

Further, Jpn. Pat. Appln. KOKAI Publication No. 2000-114382 discloses a technique of forming a dummy pattern to absorb damage at the time of fuse cutting, in a layer region of the insulation film, which is lower than a layer region in which fuses are formed, and providing a wiring layer in a further lower layer region of the insulation film. However, in the case of this technique, since a dummy pattern whose width is greater than that of the fuse is used, it is an impediment to large the interval between the fuses. Moreover, the dummy pattern itself cannot be used as a signal line or a power source line. Thus, there is the need to provide signal lines or power source lines in a further lower layer region of the insulation film, which leads to the manufacturing process becoming complex.

Further, currently, as control circuits are becoming smaller-sized, demands have arisen to small the pitch between fuses. This situation will be described hereinafter. FIG. 16 illustrates a conventional arrangement pattern of a memory cell region 53, a control circuit 54, and a fuse region. One ends of respective fuses 52 are connected via connecting wirings 56 to a fuse connecting portion 55 of the control circuit 54. Each fuse 52 comprises a fusing portion 57, and a control side connecting end 58 and a common side connecting end 59 connected to the ends of the fusing portion 57. A common signal line 60 is connected to the common side connecting ends 59. At the time of operation of the semiconductor device, common electric potential is applied to the common signal line 60, and the respective common side connecting ends 59 of the plural fuses have the same electric potential.

Signal lines 61, such as power source lines, signal lines or the like one ends of which are connected to the memory cell region 53 and the control circuit 54, are formed to have a pattern rounding the region at which the fuses are formed.

The other ends of the signal lines 61 are connected to another circuit region (not shown).

As shown in FIG. 15, the fuses arranged in a row in the surface-extension direction of the semiconductor substrate 50 are, as shown in FIG. 16, connected to the control circuit 54. With the advance of miniaturization of semiconductor devices, miniaturization of these control circuits 54 has progressed, and the demand for smaller pitches between fuses in accordance with the size reduction of control circuits has arisen.

However, the limit of small sizing the pitch between fuses is restricted by the beam diameter of the radiated laser. Thus, the pitch between fuses cannot be made more small coincident with the small-sizing of the control circuit 54.

Further, conventionally, since wirings cannot be formed at the lower layer region of the insulation film, thus, wirings such as power source lines, signal lines and the like are provided an area other than the fuse forming area of the semiconductor substrate. That is, it is necessary to define the wiring forming area independently on the semiconductor substrate, and as a result, the chip size increases and the manufacturing costs increase. Since wirings such as power source lines, signal lines and the like are provided in a manner so as to be avoided from being formed in the regions where fuses are formed, the wiring lengths become long. Thus, problems arise in that voltage drops and signal transfer delays arise, the power consumption increases, and the speed of operation becomes lower.

Moreover, accompanying the higher integration of control circuits, the connecting regions of control circuits with the fuse regions have become smaller, and a problem arises in that the number of fuses which can be connected to the control circuit becomes smaller. On the other hand, there are limits to make the radiation beam diameter of the laser smaller, due to constraints of laser radiating devices. Thus, there is the need to keep the fuse width and the fuse pitch within the constraints of the laser radiation diameter. Therefore, there are limits to decreasing the fuse width and the fuse pitch. As a result, there are limits to increasing the number of fuses to be connected to a smaller-sized control circuit.

BRIEF SUMMARY OF THE INVENTION

According to a first aspect of the present invention, there is provided a semiconductor device comprising: a semiconductor substrate; an interlayer insulation film formed above the semiconductor substrate; a fuse formed on or in the interlayer insulation film; and a wiring layer formed in a portion of the interlayer insulation film, which is under the fuse, the wiring layer being isolated from the fuse and having a width smaller than the fuse.

According to a second aspect of the present invention, there is provided a semiconductor device comprising: a semiconductor substrate; an interlayer insulation film formed above the semiconductor substrate; a fuse arrangement including a plurality of fuses formed on or in the interlayer insulation film in substantially parallel with each other to extend in a surface-extension direction of the semiconductor substrate; and wiring layers formed in the interlayer insulation film in the surface-extension direction of the semiconductor substrate, which are under the fuses, the wiring layers being isolated from the fuses and having a width smaller than the fuses.

BRIEF DESCRIPTION OF THE SEVERAL VIEWS OF THE DRAWING

FIG. 12 is a plan view of a semiconductor device according to a modified example of the second embodiment of the present invention;

DETAILED DESCRIPTION OF THE INVENTION

Hereinafter, embodiments of the present invention will be described with reference to the drawings.

(First Embodiment)

Figure 1:
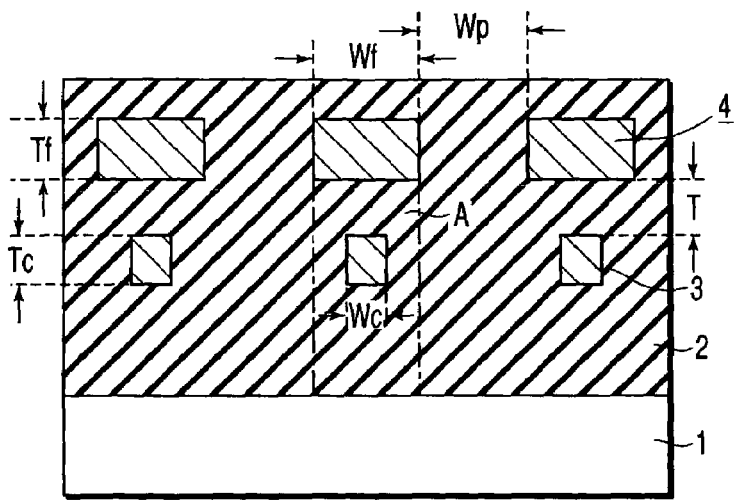
FIG. 1 is a cross sectional view of a semiconductor device according to a first embodiment of the present invention.

A semiconductor device according to a first embodiment of the present invention will be described by using FIG. 1 through FIG. 7. FIG. 1 is a cross sectional view taken along the line I—I in FIG. 7.

An interlayer insulation film 2 having a thickness of about 2.5 μm and formed from, for example, a silicon oxide film is formed on a semiconductor substrate 1 of, for example, silicon. A plurality of wiring layers 3 (only three wiring layers are shown in FIG. 1) are formed in a surface-extension direction of the semiconductor substrate 1 at substantially a constant interval or pitch in the interlayer insulation film 2. Also, in the interlayer insulation film 2, a plurality of fuses 4 (only three fuses are shown in FIG. 1) are formed in the surface-extension direction of the substrate 1 at substantially a constant interval or pitch. The wiring layers 3 are formed under the fuses 4. Further, the width of the wiring layer 3 is smaller than the width of the fuse.

The fuses 4 may be formed on the surface of the interlayer insulation film 2, and a passivation film formed from a silicon nitride film or the like may be formed on the fuses 4.

Figure 7:
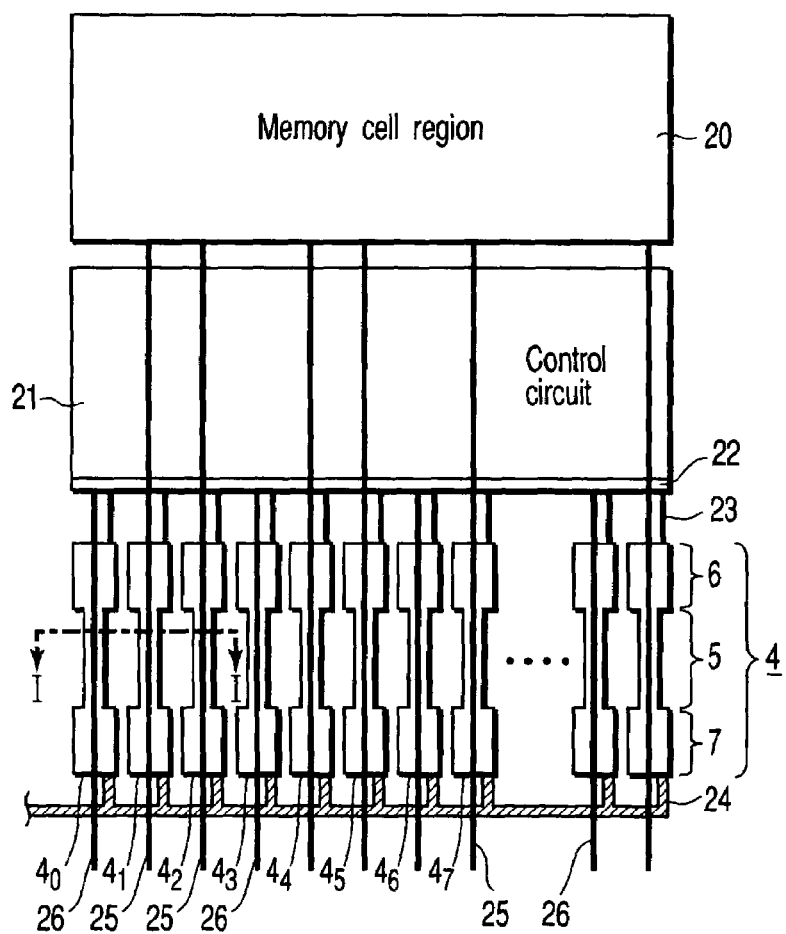
FIG. 7 a plan view of the semiconductor device according to the first embodiment of the present invention.

As shown in FIG. 7, the fuse 4 has a fusing region 5, a control circuit side end portion 6, and a common electric potential side end portion 7. The fuse 4 is cut by Joule heat generated by radiating a laser onto the fusing region 5. The length of the fusing region 5 of the fuse 4 is, for example, about 5.0 μm, and the widths of both of the control circuit side end portion 6 and the common electric potential side end portion 7 of the fuse 4 are, for example, about 2.0 μm.

As shown in FIG. 1, each of the wiring layers 3 is formed in a portion of the interlayer insulation film 2, which is under the corresponding fuse 4. The interlayer insulation film portion under the fuse 4 is portion A shown in FIG. 1. That is, the interlayer insulation film portion under the fuse 4 is a portion sandwiched by the two one-dot chain lines in FIG. 1. Further wirings may be formed in a multilayer form in the interlayer insulation film portion under the fuse 4. In FIG. 1, only three fuses 4 are shown, and in actually, several thousands or more fuse elements 4 are generally formed in one fuse portion.

An experimental example will be herein shown. The fuse 4 was formed from a material layer which is the same as that from which the wiring (not shown) is formed. The experiment was carried out for the case of a fuse whose principal component was Al. Specifically, experiments were carried out with respect to a laminated film of TiN/Ti/AlCu/TiN/Ti and a laminated film of AlCu/Nb. Here, AlCu means a mixed material of Al and Cu in which Al is a principal component. Further, an experiment for the case of a fuse in which Cu was the principal component, was carried out as well. Specifically, an experiment was carried out for a laminated film of Cu/BM. BM denotes a barrier metal, for example, TaN, TiN, Ti, Ta, or the like.

The wiring layer 3 was formed from a material layer which is the same as that from which other wirings, not shown in the figure, are formed. An experiment was carried out for a case of a wiring layer formed from a laminated film of TiN/Ti/AlCu/TiN/Ti. The wiring layer 3, for example, may be a laminated film of AlCu/Nb, a laminated film of Cu/BM, or a laminated film in which W is the principal component.

The shapes of the laser radiated fuse in a case in which a layout pitch Wp of the fuses 4 was about 2.0 μm, a width Wf of the fuse 4 was about 1.0 μm, and a film thickness Tf of the fuse 4 was about 400 nm are shown in FIGS. 2A, 2B, 2C and 2D. Although three fuses are shown in FIGS. 2A, 2B, 2C and 2D, a laser is radiated to only the central fuse 4.

A width Wc of the wiring layer 3 is, for example, about 0.5 μm, and a film thickness Tc thereof is, for example, about 400 nm. Further, a pulse width of the laser used is about 5 nsec. to 20 nsec., and a beam diameter thereof is about 2.0 μmφ. An infrared laser having a wavelength of 1321 nm was used. An infrared laser having a wavelength of 1047 nm may be used, instead.

Figure 2A:
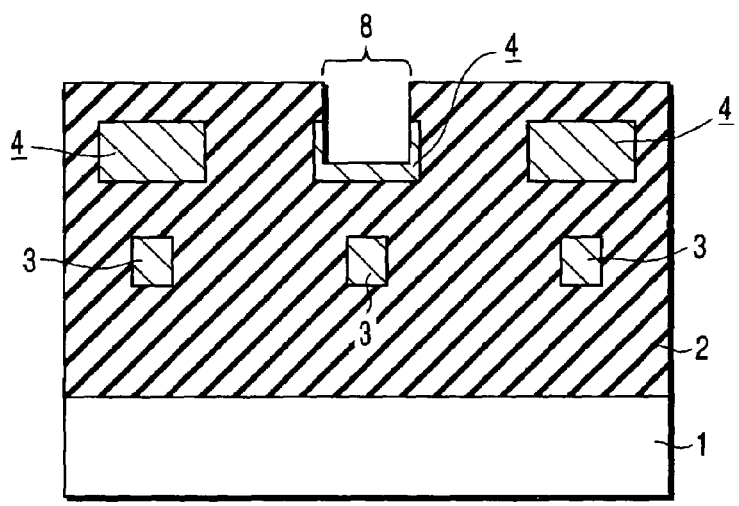
FIG. 2A is a cross sectional view when laser radiation energy of the semiconductor device according to the first embodiment of the present invention is 2.5 J/cm$^2$.
Figure 2B:
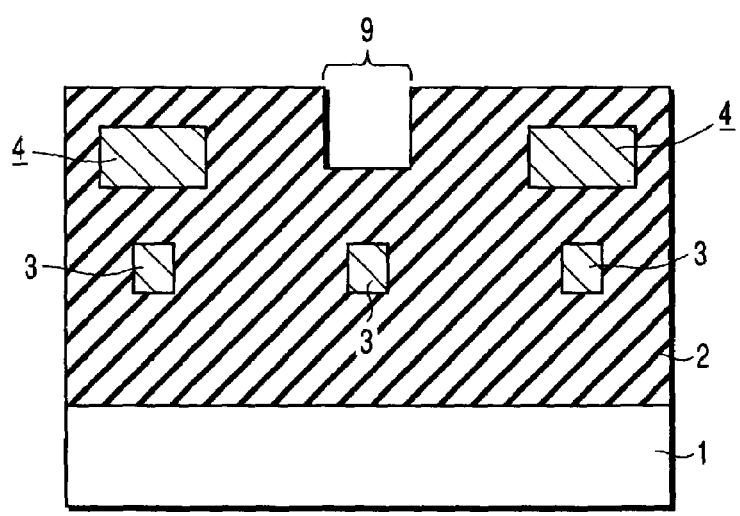
FIG. 2B is a cross sectional view when laser radiation energy of the semiconductor device according to the first embodiment of the present invention is 5 J/cm$^2$.
Figure 2C:
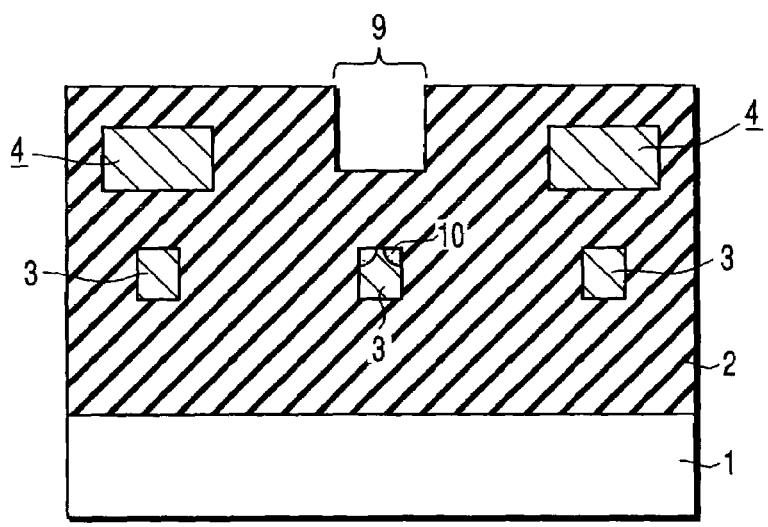
FIG. 2C is a cross sectional view when laser radiation energy of the semiconductor device according to the first embodiment of the present invention is 10 J/cm$^2$.
Figure 2D:
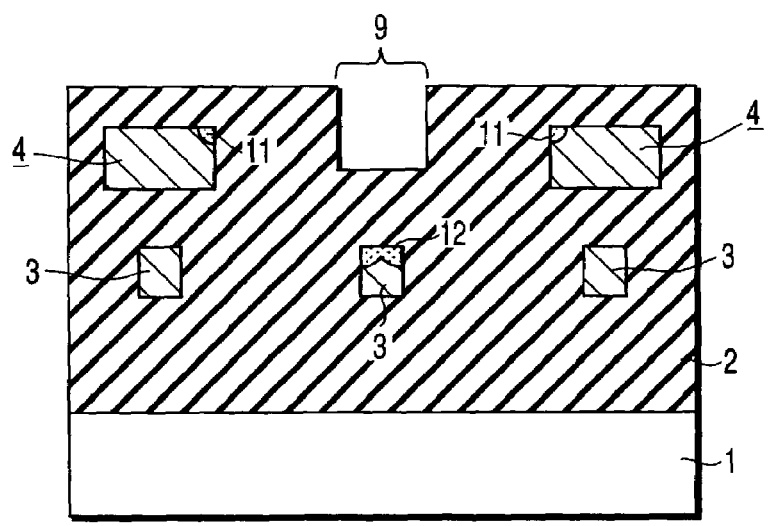
FIG. 2D is a cross sectional view when laser radiation energy of the semiconductor device according to the first embodiment of the present invention is 15 J/cm$^2$.

FIG. 2A shows the shape of the fuse after being radiated with a laser when the radiated laser energy density is 2.5 J/cm$^2$, FIG. 2B shows the shape of the fuse after being radiated with a laser when the radiated laser energy density is 5 J/cm$^2$, FIG. 2C shows the shape of the fuse after being radiated with a laser when the radiated laser energy density is 10 J/cm$^2$, and FIG. 2D shows the shape of the fuse after being radiated with a laser when the radiated laser energy density is 15 J/cm$^2$.

As shown in FIG. 2A, when the radiated laser energy density is 2.5 J/cm$^2$, the fuse 4 cannot be sufficiently cut, and the remnant of the fuse 4 which were not eliminated existed at the bottom portion of an opening 8 formed by radiation of the laser.

As shown in FIG. 2B, when the radiated laser energy density was 5 J/cm$^2$, the fuse 4 could be cut without damaging the wiring layer 3. Namely, the fuse 4 does not remain in an opening 9 formed by radiation of the laser, and the interlayer insulation film 2 is exposed.

As shown in FIG. 2C, when the radiated laser energy density is 10 J/cm$^2$, although there is no change in the size of the opening 9 in comparison with the case of FIG. 2B, a damaged portion 10 arises at an upper end portion of the wiring layer 3 formed below the opening 9. In a state in which damage arises in this way, there are problems with the reliability of the wiring and the fuses.

As shown in FIG. 2D, when the radiated laser energy density is 15 J/cm$^2$, although there is no change in the size of the opening 9 in comparison with the cases of FIG. 2B and FIG. 2C, damaged portions 11 arise at the upper end portions, adjacent to the opening 9, of the two fuses 4 adjacent to the opening 9. Moreover, a damaged portion 12 arises over a wider range than in the case of FIG. 2C at the upper end portion of the wiring layer 3 under the opening 9. In a state in which damage arises in this way, there are problems with the reliability of the wiring and the fuses.

From the experiments, it was found that when the wiring layer 3 was formed in the interlayer insulation film portion under the fuse 4, it was possible to cut only the fuse 4 without damaging the wiring layer 3 by laser radiation, when the radiated energy is 5 J/cm$^2$.

Note that the radiated energy and fusing state of the fuse are changed due to factors such as the thickness, the material or the like of the fuse.

Figure 3:
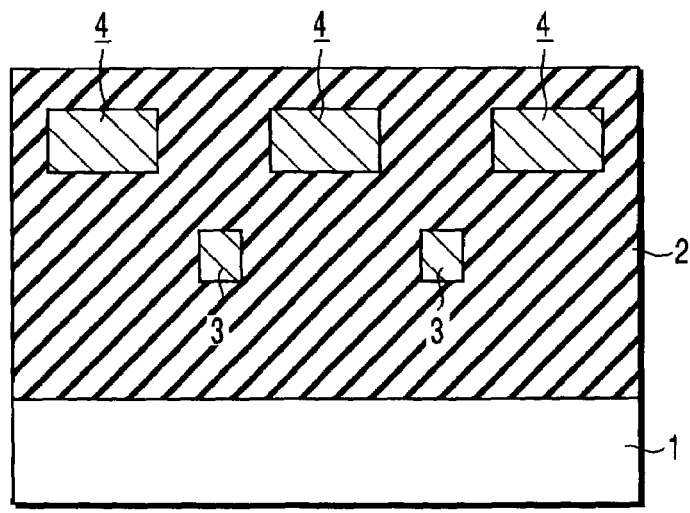
FIG. 3 is a cross sectional view of a semiconductor device of a comparative example of the semiconductor device according to the first embodiment of the present invention.

Next, an experiment was carried out, for comparison, for a case in which the wiring layers 3 are formed in portions of the interlayer insulation film 2, which are between the adjacent fuses 4 but at a layer region lower than the layer region where the fuses 4 are formed, as shown in FIG. 3. In the semiconductor device shown in FIG. 3, unlike the semiconductor device shown in FIG. 1, the wiring layers 3 are not formed in the interlayer insulation film portion under the fuse 4. In FIG. 3, three fuses are shown, but the laser was radiated onto only the central fuse 4. Further, the pulse width, the beam diameter, and the wavelength of the laser used were the same conditions as those used with respect to FIGS. 2A through 2D.

The semiconductor device shown in FIG. 3 is the same as the semiconductor device shown in FIG. 1 in the materials and sizes of the respective parts or elements except for the arrangement position of the wiring layers 3.

Figure 4A:
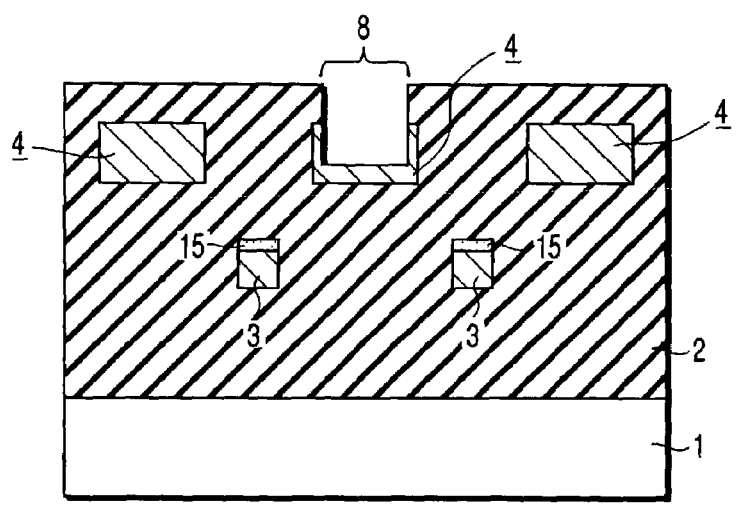
FIG. 4A is a cross sectional view when laser radiation energy of the semiconductor device of the comparative example of the semiconductor device according to the first embodiment of the present invention is 2.5 J/cm$^2$.
Figure 4B:
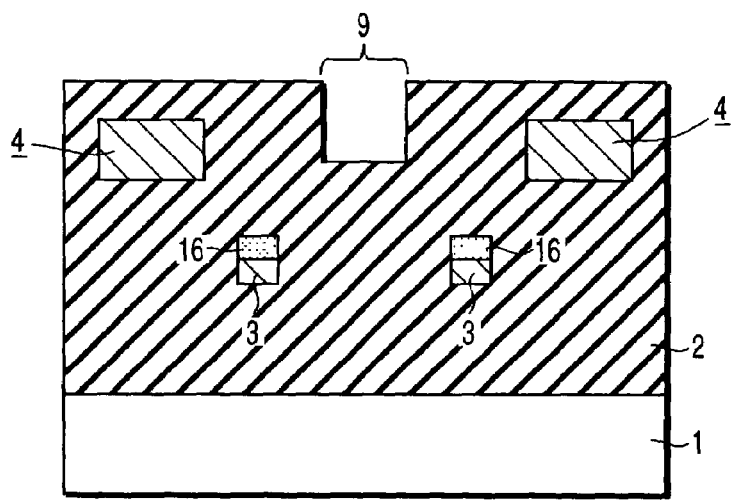
FIG. 4B is a cross sectional view when laser radiation energy of the semiconductor device of the comparative example of the semiconductor device according to the first embodiment of the present invention is 5 J/cm$^2$.
Figure 4C:
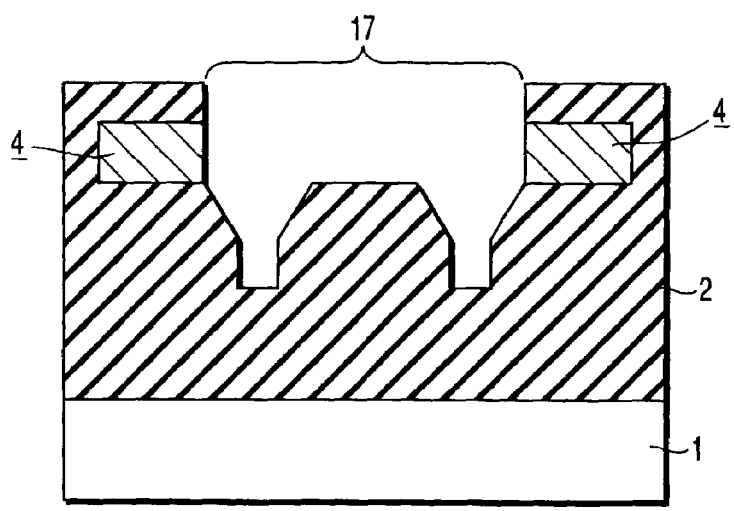
FIG. 4C is a cross sectional view when laser radiation energy of the semiconductor device of the comparative example of the semiconductor device according to the first embodiment of the present invention is 10 J/cm$^2$.
Figure 4D:
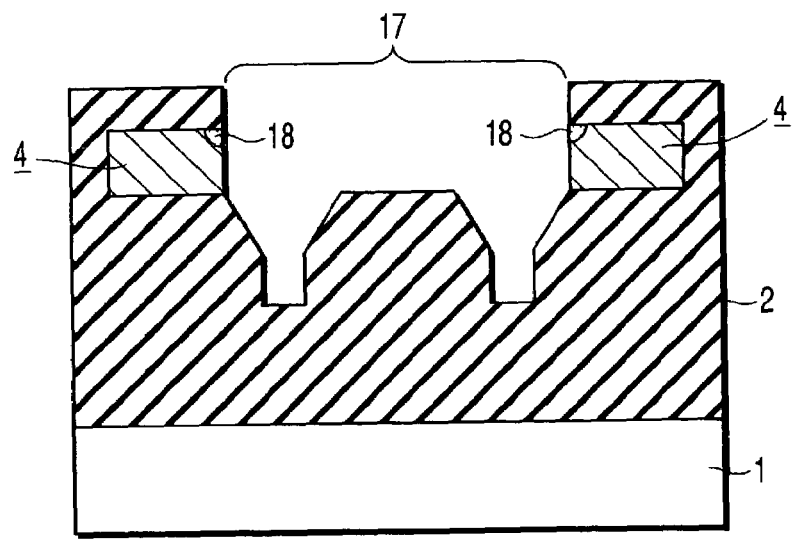
FIG. 4D is a cross sectional view when laser radiation energy of the semiconductor device of the comparative example of the semiconductor device according to the first embodiment of the present invention is 15 J/cm$^2$.

FIG. 4A shows the shape of the fuse after being radiated with a laser when the radiated laser energy density is 2.5 J/cm², FIG. 4B shows the shape of the fuse after being radiated with a laser when the radiated laser energy density is 5 J/cm², FIG. 4C shows the shape of the fuse after being radiated with a laser when the radiated laser energy density is 10 J/cm², and FIG. 4D shows the shape of the fuse after being radiated with a laser when the radiated laser energy density is 15 J/cm².

As shown in FIG. 4A, when the radiated laser energy density is 2.5 J/cm², the fuse 4 cannot be sufficiently cut, and the remnant of the fuse 4 which have not been eliminated existed at the bottom portion of the opening 8 on the interlayer insulation film 2. Moreover, damaged portions 15 arise at the upper portions of the two wiring layers 3 close to the opening 8.

As shown in FIG. 4B, when the radiated laser energy density was 5 J/cm², the fuse 4 was cut. However, damaged portions 16 arise at the upper portions of the two wiring layers 3 close to the opening 9 which is the portion at which the cut fuse 4 was formed. These damaged portions 16 extend over a larger range than the damaged portions 15 arising in FIG. 4A. Namely, when the wiring layers 3 are formed in portions of the interlayer insulation film 2, which are between the adjacent fuses 4 but at a layer region lower than the layer region where the fuses 4 are formed, it is impossible to cut only the fuse without radiation damaging the wiring layers 3. In a state in which damage arises in this way, there are problems with the reliability of the wiring and the fuses. As shown in FIG. 4C, when the radiated laser energy density is 10 J/cm², the two wiring layers 3 are blown and completely eliminated, and an opening 17 is formed. The opening 17 exposes the side surfaces of the two fuses 4 adjacent to the both sides of the fuse 4 onto which the laser was radiated. The opening 17 is formed due to the eliminated two wiring layers 3 and the interlayer insulation film 3 which existed thereabove being eliminated, and is partially tapered to expose the peripheral interlayer insulation film 2. The reason why such a large opening 17 arises is because the radiated energy passes through the interlayer insulation film 2 and is absorbed by the wiring layers 3 so that the wiring layers 3 are melted and vaporized, and the metallic vapor blows off the interlayer insulation film 2 on the wiring layers 3.

As shown in FIG. 4D, when the radiated laser energy density is 15 J/cm², although there is no change in the size of the opening 17, damaged portions 18 arise at the upper end portions, adjacent to the opening 17, of the two fuses 4 adjacent to the opening 17.

As is obvious from the above-described experiments, only when a wiring layer is formed in a portion of the interlayer insulation film 2, which is under the fuse 4, it is possible to cut only the fuse without damaging the wiring layer. This mechanism will be described hereinafter.

When laser radiation is started, the temperature of the fuse rises and evaporation of the fuse occurs. However, at the time of completion of the laser radiation (5 nsec. to 20 nsec. after the start of radiation), high-density metallic vapor which has started to vaporize and a portion of the melted fuse layer remain in the place at which the fuse existed and in the space above the place. The metallic vapor shields penetration of the laser onto the lower portion of the fuse.

As a result, the radiated laser beam is not radiated to the wiring layers 3. After radiation of the laser is completed, the vapor, which had formed the fuse and which obtained high thermal energy, violently blows up so that the upper layer portion of the insulation film is blown off, and is emitted to the external environment.

In this way, even if the fuse is evaporated by radiation of laser beam, by using a laser having a short pulse such that the laser radiation is completed during the time when the vapor remains at the place where the fuse was formed, it is possible to cut the fuse without damaging the wiring formed under the fuse.

Next, the diffraction phenomenon of the laser beam will be described by reference to FIG. 5. The energy distribution of the radiated laser applied to the surface of the interlayer insulation film 2 is shown above the interlayer insulation film 2 in FIG. 5. The lateral direction of this energy distribution corresponds to the coordinate of the surface-extension direction of the substrate 1, and the vertical direction corresponds to the energy amount. As shown by this distribution curve, the amount of radiated energy is the largest at the central fuse 4 to which laser is radiated. Further, in the surface-extension direction of the substrate 1, moving away from the central fuse 4 to which the laser is radiated, the radiated energy gradually decreases.

Figure 5:
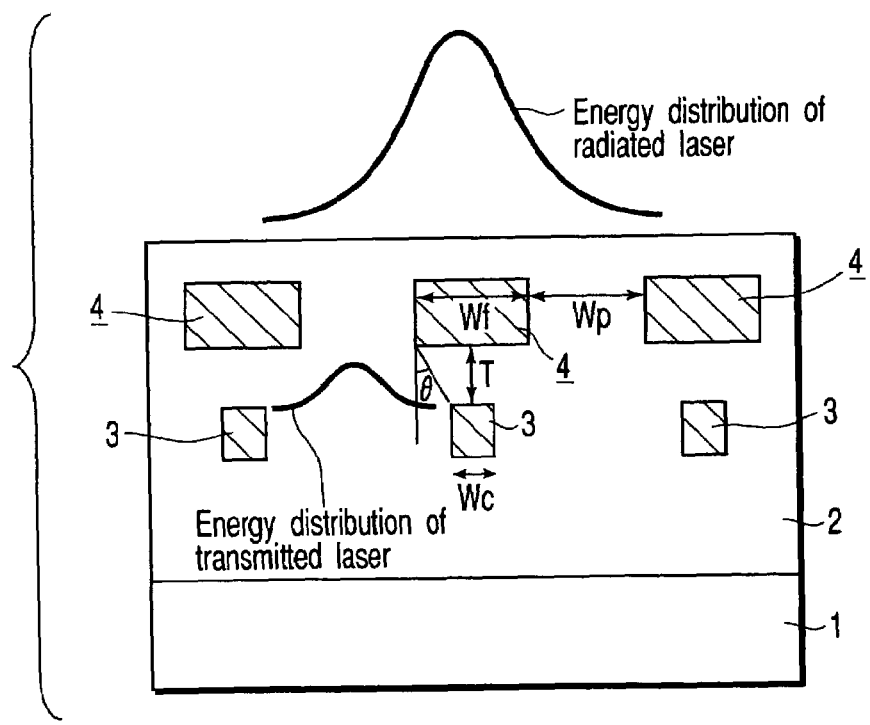
FIG. 5 is a cross sectional view for explaining a diffraction phenomenon of the semiconductor device according to the first embodiment of the present invention.

In FIG. 5, the radiated energy distribution in the interlayer insulation film 2 at a depth position in the vicinity of the upper surface of the wiring layer 3 between the central fuse 4 and the left side fuse 4 is shown as an energy distribution of the transmitted laser. In this distribution as well, the lateral direction corresponds to the coordinate of the surface-extension direction of the substrate 1, and the vertical direction corresponds to the energy amount. As shown by this distribution curve, the amount of radiated energy is the largest in the vicinity of the center of the central fuse 4 to which the laser is radiated and the left side fuse 4. Further, in the surface-extension direction of the substrate 1, moving away from the position of the maximum energy, the radiated energy gradually decreases. In this way, the energy of the radiated laser which is propagated to the wiring layer 3 changes depending on the position of the wiring layer 3. Although not shown and not explained, the same is true for the radiated energy distribution between the central fuse 4 and the right side fuse 4.

A wavelength of the laser used in the present embodiment is 1321 nm, and this wavelength is a wavelength of substantially the same level of a fuse having a width of 1.0 μm. In such a case, even if the laser beam is shielded by a fuse, the laser is diffracted at the interlayer insulation film portion under the fuse.

A width θ of laser diffraction is given by the following formula (1).

$$\theta = \lambda/2nWf \qquad (1)$$

Here, λ is a wavelength of the laser beam, Wf is a width of the fuse, and n is a refractive index of the interlayer insulation film.

Due to a width Wc of the wiring layer being set to a width satisfying the following formula (2) by using the fuse width Wf, laser beam radiation to the wiring layer can be substantially suppressed.

$$Wc \geq Wf\text{-}2T\tan\theta \qquad (2)$$

Here, T is a distance between a bottom surface of the fuse and the upper surface of the wiring layer which face each other.

Figure 6A:
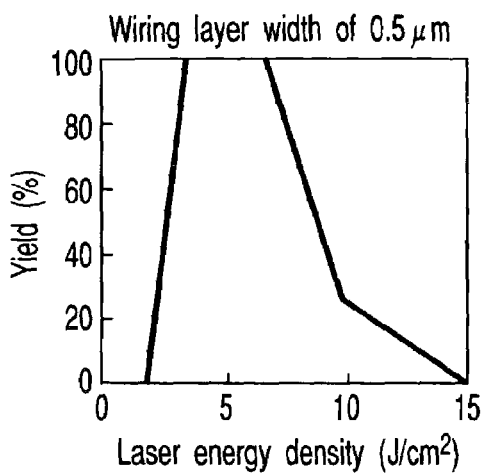
FIG. 6A is a graph showing the relationship between laser energy density and yield when a wiring layer width is 0.5 μm in the semiconductor device according to the first embodiment of the present invention.
Figure 6B:
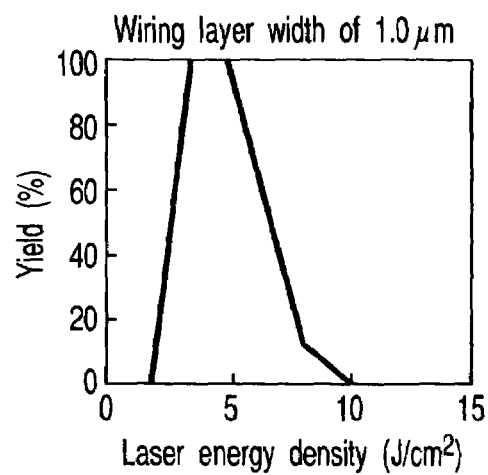
FIG. 6B is a graph showing the relationship between laser energy density and yield when the wiring layer width is 1.0 μm in the semiconductor device according to the first embodiment of the present invention.

Next, the probability that the fuse will be cut without damaging the wiring layer when a width of the fuse is 1.0 μm will be described by reference to FIGS. 6A and 6B. In FIGS. 6A and 6B, the abscissa shows laser radiation energy density, and the ordinate shows yield in %. Here, yield is the probability that the fuse can be cut without damaging the wiring layer.

As shown in FIG. 6A, when the width of the wiring layer is 0.5 μm, and when the fuse is cut in a range in which the laser energy density is from about 4 J/cm$^2$ to about 7 J/cm$^2$, the fuse can be cut without damaging the wiring layer, at a yield of 100%.

Further, as shown in FIG. 6B, when the width of the wiring layer is 1.0 μm, and when the fuse is cut in a range in which the laser energy density is from about 4 J/cm$^2$ to about 5.5 J/cm$^2$, the upper fuse can be cut without damaging the wiring layer, at a yield of 100%.

By comparing FIGS. 6A and 6B, it can be seen that the range of energy radiation densities which can obtain a yield of 100% when the wiring width of the wiring layer is 0.5 μm is larger than that when the width is 1.0 μm.

The reason that the yield when the width of the wiring layer is 1.0 μm is worse than when the width of the wiring layer is 0.5 μm, is because the yield is affected by the diffraction of the laser beam. Namely, when the width of the wiring layer is 1.0 μm, a beam diffracted by the fuse is radiated to the wiring layer, and on the other hand, when the width of the wiring layer is 0.5 μm, the formula (2) is satisfied, and the laser beam can substantially be blocked from radiation to the wiring layer. Due to the width of the wiring layer being a width satisfying the formula (2), the yield can be improved.

Next, a plan view pattern will be described by reference to FIG. 7 showing a plan view of the semiconductor device of the present embodiment shown in FIG. 1. The fuses 4 are arranged in a longitudinal direction (row direction) of a connecting terminal portion 22 of a control circuit 21. Also, the fuses 4 are arranged side by side and extend in a direction (column direction) perpendicular to the longitudinal direction (row direction) of the connecting terminal portion 22 of the control circuit 21. Further, the fuses 4 are arranged to be set apart from each other at substantially a constant distance. A memory cell region 20 and the control circuit 21 are formed in the vicinity of a fuse region at which the plurality of fuses 4 are formed. The control circuit side end portions 6 of the fuses 4 are connected to the connecting terminal portion 22 of the control circuit 21 via fuse wirings 23. The common electric potential side end portions 7 of the plurality of fuses 4 are connected to a common electric potential line 24, and at the time of operation, the same electric potential is supplied to the common electric potential side end portions 7 via the common electric potential line 24.

The common electric potential line 24 comprises a conductive layer, for example, a well formed in the semiconductor substrate. Alternatively, a metal wiring may be formed in the interlayer insulation film and the metal wiring may be used as the common electric potential line 24.

The common electric potential line 24 is connected to the common electric potential side end portions 7 by means of via-contacts (not shown). The wiring layers 25 and 26 may be formed in the same layer region or alternatively different layer regions.

For convenience of explanation, in FIG. 7, the fuses are denoted by $4_0$, $4_1$, $4_2$, .... For example, wiring layers 25 for memory signals, whose one ends are connected to the memory cell region 20, are formed under the fuses $4_1$ and $4_2$, for example. On the other hand, for example, wiring layers 26 for control signals, whose one ends are connected to the control circuit 21, are formed under the fuses $4_0$ and $4_3$.

In accordance with the present embodiment, it is possible to cut only the fuses without damaging the wiring layer by laser radiation.

Therefore, it is possible to form wiring layers, which maintain reliability, under the fuses, and a semiconductor device in which the wiring region is made to have a smaller surface area can be provided. Further, by specifying the range of the width of the wiring layers formed in the lower layer region of the interlayer insulation film, laser radiation onto the wiring layers is substantially suppressed, and the yield of the semiconductor device is improved.

As shown in FIG. 7, due to the structure in which power source lines and signal lines are formed under the fuses, the lengths of the power source lines and the signal lines can be shortened. Therefore, the size of a chip is made to be small, and the extent of the voltage drop at the power source lines or the signal lines is suppressed. Electric power consumption is decreased, and moreover, the speed of operation is improved.

If the present embodiment is applied to a semiconductor device such as, in particular, a logic LSI in memory including many signal lines and fuses, the required surface area is remarkably decreased.

(Modified Example of the First Embodiment)

Figure 8:
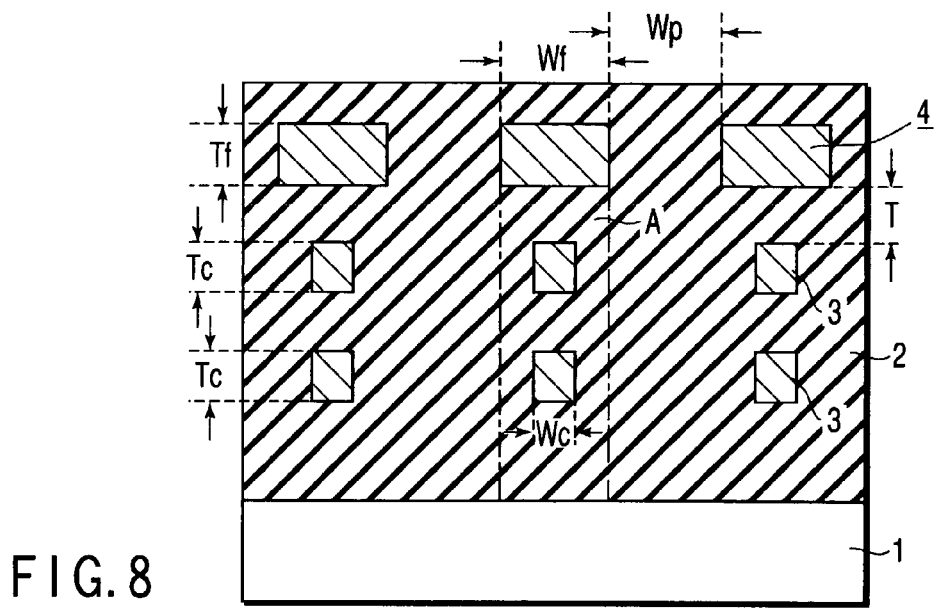
FIG. 8 is a cross sectional view of a semiconductor device according to a modified example of the first embodiment of the present invention.

In an example shown in FIG. 8, wiring layers 3 are formed in two stages under the fuse. Namely, wiring layers 3 are formed in a second lower layer region which is a layer further lower than a first lower layer region at which wiring layers 3 are formed. The wiring layers 3 in the second lower layer region have substantially the same sizes as the wiring layers 3 of the first lower layer region and also are arranged at substantially the same pitch as the wiring layers 3 of the first lower layer region. Further, the wiring layers 3 of the second lower layer region are formed in a region A under the fuses 4, in the same way as the wiring layers 3 of the first lower layer region. Wiring layers may be formed at layer regions further lower than the second lower layer region.

In this way, by providing the wiring layers in plural stages under one fuse, even if the number of the power source lines and the signal lines is greater than the number of the fuses, even higher integration of a semiconductor device can be attained.

Figure 9:
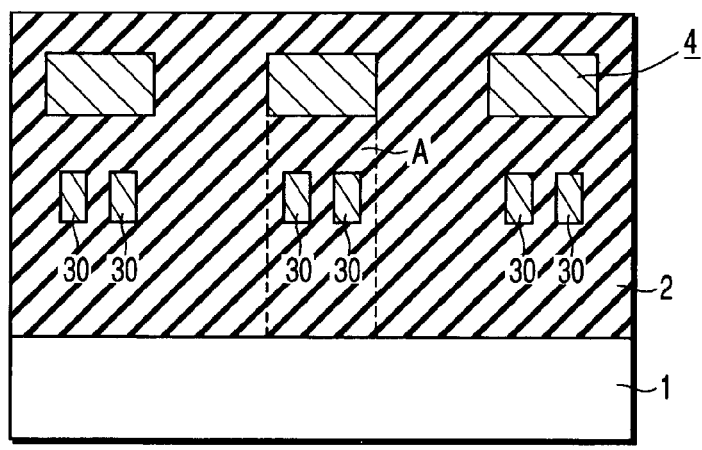
FIG. 9 is a cross sectional view of a semiconductor device according to another modified example of the first embodiment of the present invention.
Figure 10:
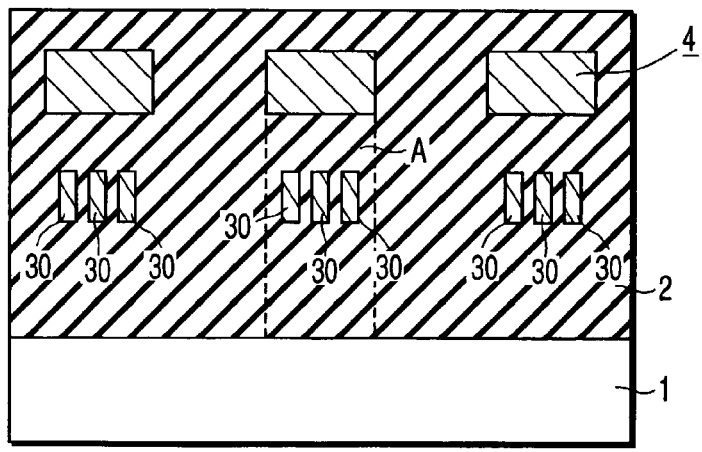
FIG. 10 is a cross sectional view of a semiconductor device according to another modified example of the first embodiment of the present invention.

In an example shown in FIG. 9, a plurality of wiring layers 30 (two wiring layers in FIG. 9) are formed under one fuse 4 to be separated from each other at substantially a constant distance in the surface-extension direction of the semiconductor substrate. In this case as well, in the same way as in the first embodiment, the wiring layers 30 are formed in region A under the fuse 4. In this embodiment, two wiring layers 30 are formed under one fuse 4, but even more wiring layers may be formed under one fuse 4. FIG. 10 shows an example in which three wiring layers 30 are formed under one fuse 4.

In this way, by providing a plurality of wiring layers under one fuse to be separated from each other at substantially a constant distance in the surface-extension direction of the semiconductor substrate, even if the number of the power source lines and signal lines is greater than the number of the fuses, there is no need to provide regions for the power source lines and the signal lines, which round the fuse regions. Therefore, even higher integration of a semiconductor device can be attained.

Further, in the example of FIG. 9 or FIG. 10, wiring layers may be formed in a further layer region lower than the layer region in which the wiring layers 30 are provided, in a similar manner as shown in FIG. 8.

(Second Embodiment)

A semiconductor device according to a second embodiment of the present invention will be described by reference to FIG. 11.

Figure 11:
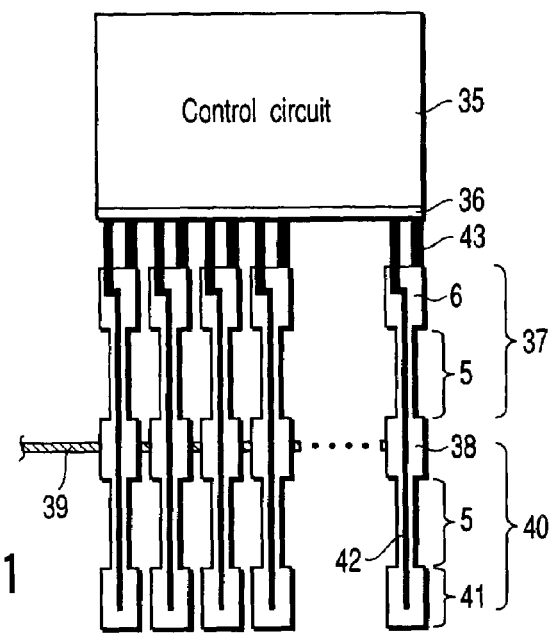
FIG. 11 is a plan view of a semiconductor device according to a second embodiment of the present invention.

In FIG. 11, an arrangement pattern of a control circuit 35 and a fuse region is shown. A common electric potential signal line 39 is connected to common electric potential side ends 38 of the fuses. At the time of operation of the semiconductor device, a common electric potential is applied to the common electric potential signal line 39, and the respective common electric potential side ends 38 of the plurality of fuses have the same electric potential.

With the advancement of miniaturization, the width (the length in the left-right direction in FIG. 11) of the control circuit 35 in FIG. 11 is reduced more than, for example, the width of the control circuit 21 of the arrangement pattern shown in FIG. 7. Therefore, the width of a connecting terminal portion 36 of the control circuit 35 as well is reduced more than the width of the connecting terminal portion 22 of the control circuit 21 of FIG. 7. Two rows of fuses, namely, a first fuse row 37 and a second fuse row 40, are connected to the control circuit 35.

The first fuse row 37 comprises a plurality of fuses arranged in a longitudinal direction (row direction) of the connecting terminal portion 36 of the control circuit 35. The plurality of fuses extend in parallel to one another in a direction (column direction) perpendicular to the longitudinal direction of the connecting terminal portion 36 of the control circuit 35 and are separated from each other at substantially a constant distance. The control circuit side end portions 6 are connected to the connecting terminal portion 36 of the control circuit 35 via wiring layers 43.

The other end portions of the respective fuses in the first fuse row 37 are the common electric potential side end portions 38, and are connected to the common electric potential line 39 provided in a direction perpendicular to the longitudinal direction of each fuse, namely, in the aforementioned row direction. At the time of operation, the same electric potential is applied to the common electric potential side end portions 38 of the respective fuses via the common electric potential line 39. The common electric potential line 39 comprises a conductive layer such as a well formed in a semiconductor substrate. Alternatively, a metal wiring may be formed in the interlayer insulation film and the metal wiring may be used as the common electric potential line 39.

The common electric potential line 39 is connected to the common electric potential side end portions 38 of the fuses by means of via-contacts (not shown). Similarly, the wiring layers 43 are connected to the control circuit side end portions 6 of the fuses by means of via-contacts (not shown).

In the same way as the first fuse row 37, the second fuse row 40 comprises a plurality of fuses arranged in a longitudinal direction (row direction) of the connecting terminal portion 36 of the control circuit 35. Also, in the same way as the fuses of the first fuse row 37, the plurality of fuses extend in parallel to one another in a direction (column direction) perpendicular to the longitudinal direction of the connecting terminal portion 36 of the control circuit 35 and are separated from each other at substantially a constant distance.

The fuses of the second fuse row 40 are provided in a one-to-one correspondence with the fuses of the first fuse row 37.

One end portions of the fuses of the second fuse row 40, which are at the first fuse row side, share common electric potential side end portions 38 with the fuses of the first fuse row 37. The other end portions of the respective fuses of the second fuse row 40 constitute connecting terminal portions 41, and one ends of first wiring layers 42 constituted by wiring layers provided under the fuses as shown in FIG. 1, are connected to the connecting terminal portions 41. The other ends of the first wiring layers 42 are connected to the connecting terminal portion 36 of the control circuit 35. The first wiring layers 42 are connected to the connecting terminal portions 41 of the fuses by means of, for example, via-contacts (not shown).

Further, one ends of the second wiring layers 43 constituted by wiring layers provided under the fuses, are connected to the control circuit side terminal portions 6 of the respective fuses of the first fuse row 37. The other ends of the second wiring layers 43 are connected to the connecting terminal portion 36 of the control circuit 35.

Means for connecting the control circuit to the first fuse row is not limited to the wiring layers formed under the fuse, and wirings (not shown) provided in the same layer region as the fuses may be used. Moreover, although illustration of a memory cell region is omitted from FIG. 11, in the same way as in the case of the memory cell region 20 shown in FIG. 7, the memory cell region may be provided at a side of the control circuit, which is opposite to the fuse region.

Moreover, the fuse rows can be increased to three rows, four rows, . . . , n rows (n is a natural number).

(Modified Example of the Second Embodiment)

FIG. 12 shows a structural example when there are four fuse rows. The fuse rows are formed from a first fuse row 37, a second fuse row 40, a third fuse row 45, and a fourth fuse row 46. The common electric potential side end portions 38 of the first fuse row 37 and the second fuse row 40 adjacent to each other and the common electric potential side end portions 38 of the third fuse row 45 and the fourth fuse row 46 adjacent to each other are connected to the common electric potential lines 39, respectively. At the time of operation, the same electric potential is applied via the common electric potential line 39 to the common electric potential side end portions 38 of the fuses of the adjacent fuse rows connected to the common electric potential line 39. In this example as well, in the same way as in the second embodiment, the first fuse row 37 comprises a plurality of fuses arranged in a longitudinal direction (row direction) of the connecting terminal portion 36 of the control circuit 35. The control circuit side end portions 6 of the fuses of the first fuse row 37 are connected to the connecting terminal portion 36 of the control circuit 35 via wiring layers 43.

The other end portions of the respective fuses in the first fuse row 37 are the common electric potential side end portions 38, and are connected to the common electric potential line 39.

In the same way as the first fuse row 37, the second fuse row 40 comprises a plurality of fuses arranged in a longitudinal direction (row direction) of the connecting terminal portion 36 of the control circuit 35. The fuses of the second fuse row 40 are provided in a one-to-one correspondence with the fuses of the first fuse row 37.

One end portions of the fuses of the second fuse row 40, which are at the first fuse row side, share common electric potential side end portions 38 with the fuses of the first fuse row 37. At the time of operation, the same electric potential is applied via the common electric potential line 39 to the common electric potential side end portions 38 of the fuses of the first fuse row 37 and the second fuse row 40. The other end portions of the respective fuses of the second fuse row 40 constitute connecting terminal portions 41, and one ends of first wiring layers 42 constituted by wiring layers provided under the fuses are connected to the connecting terminal portions 41. The other ends of the first wiring layers 42 are connected to the connecting terminal portion 36 of the control circuit 35.

In the same way as the first and second fuse rows 37 and 40, the third fuse row 45 comprises a plurality of fuses arranged in a longitudinal direction (row direction) of the connecting terminal portion 36 of the control circuit 35. The control circuit side end portions 6 of the fuses of the third fuse row 45 are connected to the connecting terminal portion 36 of the control circuit 35 via second wiring layers 47 constituted by wiring layers provided under the fuses. The fuses of the third fuse row 45 are provided in a one-to-one correspondence with the fuses of each of the first fuse row 37 and the second fuse row 40.

The other end portions of the respective fuses in the third fuse row 45 are the common electric potential side end portions 38, and are connected to the common electric potential line 39.

In the same way as the first, second and third fuse rows 37, 40 and 45, the fourth fuse row 46 comprises a plurality of fuses arranged in a longitudinal direction (row direction) of the connecting terminal portion 36 of the control circuit 35. The fuses of the fourth fuse row 46 are provided in a one-to-one correspondence with the fuses of each of the first, second and third fuse rows 37, 40 and 45.

One end portions of the fuses of the fourth fuse row 46, which are at the third fuse row side, share common electric potential side end portions 38 with the fuses of the third fuse row 45. At the time of operation, the same electric potential is applied via the common electric potential line 39 to the common electric potential side end portions 38 of the fuses of the third fuse row 45 and the fourth fuse row 46. The other end portions of the respective fuses of the fourth fuse row 46 constitute connecting terminal portions 48, and one ends of third wiring layers 49 constituted by wiring layers provided under the fuses are connected to the connecting terminal portions 41. The other ends of the third wiring layers 49 are connected to the connecting terminal portion 36 of the control circuit 35.

The common electric potential line 39 comprises a conductive layer such as a well formed in the semiconductor substrate. Alternatively, a metal wiring may be formed in the interlayer insulation film and the metal wiring may be used as the common electric potential line 39.

The common electric potential line 39 is connected to the common electric potential side end portions 38 of the fuses by means of via-contacts (not shown). Similarly, the wiring layers 42, 43, 47 and 49 are connected to the control circuit side end portions 6 of the fuses or the connecting terminal portions 41 and 48 of the fuses by means of a via-contacts (not shown). The wiring layers 42, 43, 47 and 49 may be formed in the same layer region or alternatively different layer regions.

As miniaturization of the elements has progressed, the size of the control circuit and the width of the connecting terminal portion have been decreased. However, on the other hand, there are limits to make the radiation beam diameter of the laser smaller, due to constraints of laser radiating devices. Thus, there is a limit to decreasing the width of the fuse and the space between the fuses. Under these circumstances, by connecting the fuses in series in a vertical direction (column direction), the required number of fuses can be arranged in correspondence with a width of the connecting terminal portion of a reduced control circuit, while overcoming the limits.

That is, a width of the connecting terminal portion of a reduced control circuit for the fuse region is decreased in accordance with the advance of the miniaturization of semiconductor devices, however, in accordance with the present embodiment, the required number of fuses can be arranged in correspondence with a width of the connecting terminal portion of a reduced control circuit.

Namely, in accordance with the present embodiment, even if the miniaturization of the control circuits advances in accordance with the advance of the miniaturization of semiconductor devices, a semiconductor device having a fuse arrangement corresponding to the miniaturization of the control circuit can be provided without changing the fuse pitch.

The number of fuse rows is set in consideration of the number of required fuses and the width of the connecting terminal region.

In the present example, the surface area occupied by the redundancy circuit, which is defined as the sum of the surface area occupied by the fuses and the surface area of the control circuit in FIG. 12, can be reduced. If the present example is applied to a semiconductor device such as, in particular, a DRAM having many fuses, the required surface area is remarkably reduced.

(Third Embodiment)

When a wiring having a wide width is formed under the fuse, or when a plurality of wirings are formed under the fuse, there are cases in which the width of the fuse must be enlarged in order to prevent damage of these wirings by laser radiation onto the fuse. Enlargement of the width of the fuse makes the surface area of the fuse region increase, and the number of mounted fuses is therefore restricted. Thus, there arises a problem that the chip relieving rate decreases. Moreover, at the time of radiating a laser to the fuse, the enlargement of the width of the fuse makes the thermal diffusion from the fuse radiation region, i.e., the fusing portion, to the peripheral fuse region large. The fuse cutting characteristic deteriorates, and resolution of this point as well is also an object.

Figures 13, 14:
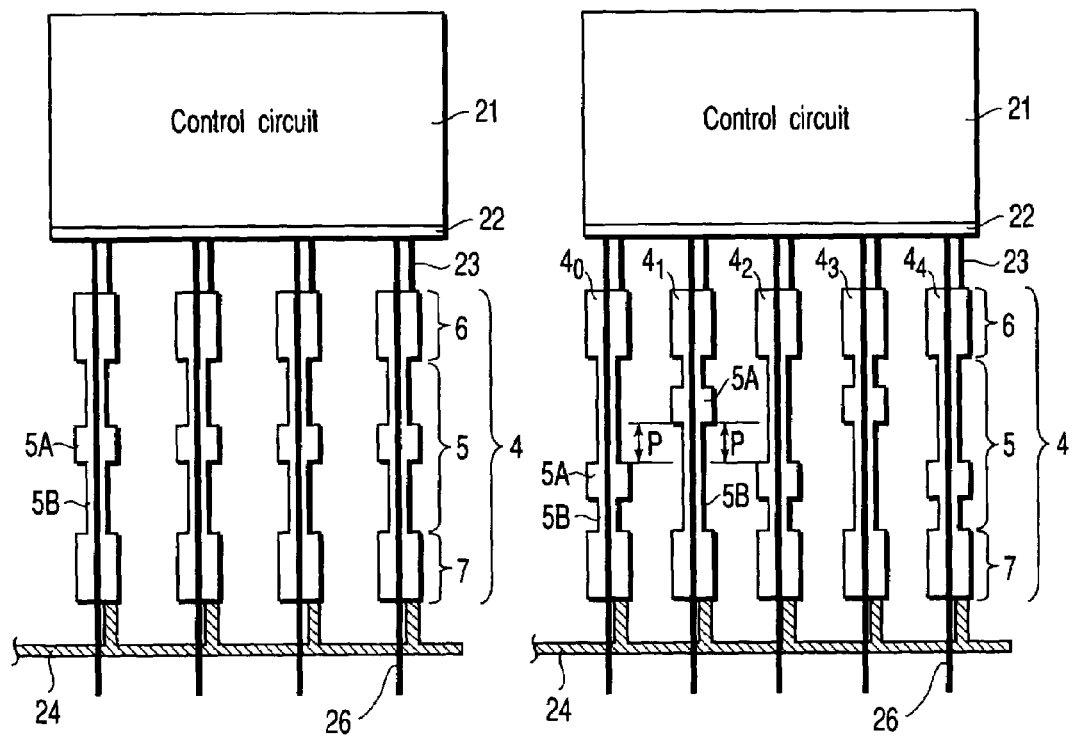
FIG. 13 is a cross sectional view of a semiconductor device according to a third embodiment of the present invention.
FIG. 14 is a plan view of a semiconductor device according to a modified example of the third embodiment of the present invention.
Figure 15:
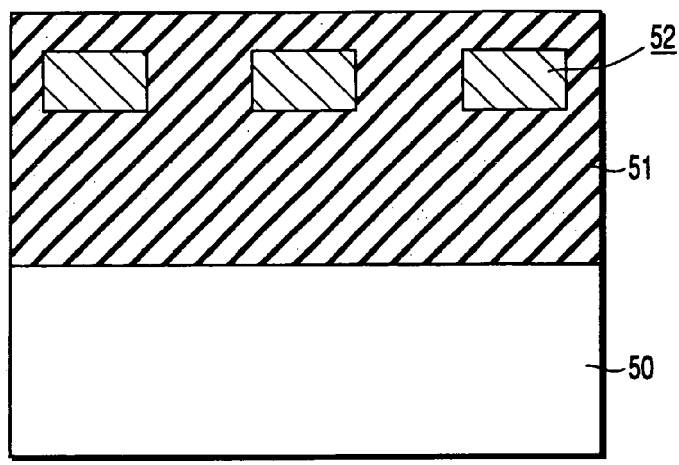
FIG. 15 is a plan view of a conventional semiconductor device.
Figure 16:
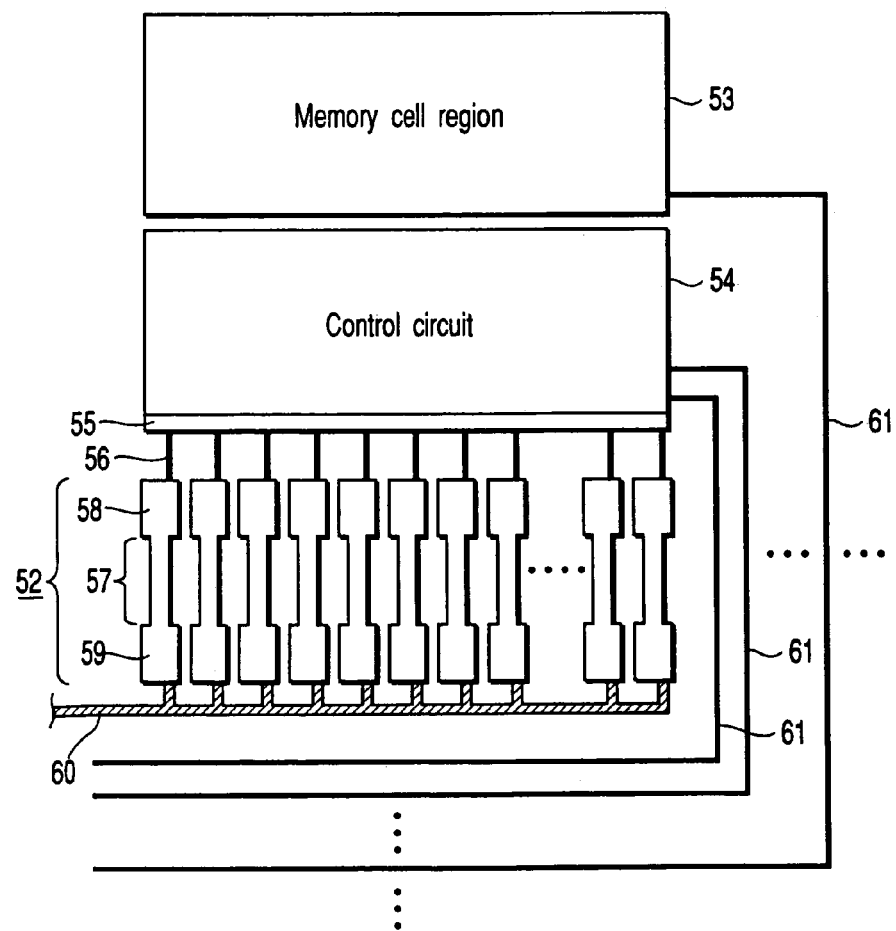
FIG. 16 is a plan view of the conventional semiconductor device shown in FIG. 15.

FIG. 13 shows an example in which the shapes of the fuse patterns are changed.

The fuses 4 are arranged in a longitudinal direction (row direction) of the connecting terminal portion 22 of the control circuit 21. The fuses 4 extend in parallel to one another in a direction (column direction) perpendicular to the longitudinal direction of the connecting terminal portion 22 of the control circuit 21 and are separated from each other at substantially a constant distance. The control circuit side end portions 6 of the fuses 4 are connected to the connecting terminal portion 22 of the control circuit 21 via wiring layers 23. The common electric potential side end portions 7 of the fuses 4 are connected to the common electric potential line 24. At the time of operation, the same electric potential is applied to the common electric potential side end portions 7 of the respective fuses via the common electric potential line 24. Control signal wiring layers 26 are provided under the fuses 4 and one ends of the control signal wiring layers 26 are connected to the connecting terminal portion 22 of the control circuit 21.

In this embodiment, the shapes of the fuse patterns are changed. Concretely, the width of region to which a laser is radiated is enlarged. Since the width of the region to which the laser is radiated is enlarged, even if a large wiring or a plurality of wirings are formed under the radiated region 5A (the enlarged radiation region 5A of the fuse), laser radiation to these wirings can be avoided, and damage by laser radiation to these wirings can be avoided. On the other hand, a fuse region 5B which is other than the radiated region 5A (i.e., a peripheral region 5B) remains small in the same way as in the conventional art. At the time of radiating a laser to the enlarged radiation region 5A, although the heat generated in the enlarged radiation region 5A is diffused via the peripheral region 5B, because the peripheral region 5B remains narrow, the heat diffusion can be kept low, and the fusing characteristic of the fuse does not deteriorate.

In FIG. 13, the memory cell 20 and the like shown in FIG. 7, which do not directly relate to the description, are omitted. The common electric potential line 24 comprises a conductive layer such as a well formed in a semiconductor substrate. Alternatively, a metal wiring may be formed in the interlayer insulation film and the metal wiring may be used as the common electric potential line 24.

The common electric potential line 24 is connected to the common electric potential side end portions 38 of the fuses by means of via-contacts (not shown).

(Modified Example of the Third Embodiment)

FIG. 14 shows a modified example of the third embodiment shown in FIG. 13, in which the shapes of the fuse patterns are changed.

The fuses 4 are arranged in a longitudinal direction (row direction) of the connecting terminal portion 22 of the control circuit 21. The fuses 4 extend in parallel to one another in a direction (column direction) perpendicular to the longitudinal direction of the connecting terminal portion 22 of the control circuit 21 and are separated from each other at substantially a constant distance. The control circuit side end portions 6 of the fuses 4 are connected to the connecting terminal portion 22 of the control circuit 21 via wiring layers 23. The common electric potential side end portions 7 of the fuses 4 are connected to the common electric potential line 24. At the time of operation, the same electric potential is applied to the common electric potential side end portions 7 of the respective fuses via the common electric potential line 24. Control signal wiring layers 26 are provided under the fuses 4 and one ends of the control signal wiring layers 26 are connected to the connecting terminal portion 22 of the control circuit 21.

In this modified example, the shapes of the fuse patterns are changed. Concretely, the enlarged radiation regions 5A are arranged so as to be alternately offset between adjacent fuses. As shown in FIG. 14, the enlarged radiation regions 5A are arranged to be offset from each other by a predetermined pitch P in a longitudinal direction of the fuses between adjacent fuses in one fuse row. For convenience of explanation, the fuses are denoted by $4_0$, $4_1$, $4_2$, . . . .

Specifically, for example, the enlarged radiation region 5A of the fuse $4_1$ is provided closer to the control circuit side by the pitch P than the enlarged radiation region 5A of the adjacent fuse $4_0$. Further, the enlarged radiation region 5A of the fuse $4_2$ is provided to be further away from the control circuit side by the pitch P than the enlarged radiation region 5A of the adjacent fuse $4_1$. In this way, the enlarged radiation regions 5A are arranged to be offset from each other alternately at the adjacent fuses. Therefore, as compared with the example of FIG. 13, the distance between the adjacent fuses can be made to be small, and the number of the fuses which can be arranged in the same surface area can be increased. For example, in the case of the example of FIG. 13, the number of fuses is four, where as in the case of the example of FIG. 14, the number of fuses is five, and one more fuse can be arranged.

Further, in the case of the example of FIG. 14, if an increase in the number of the fuses is kept small to a certain extent, as compared with the example of FIG. 13, the margin of radiation control of the laser can be made larger. In other words, the laser radiation surface area can be made large.

Namely, for example, at the time of radiating a laser to the enlarged radiation region 5A of the fuse $4_1$ in order to fuse the fuse $4_1$, radiating the laser to the enlarged radiation region 5A and the peripheral region 5B of the adjacent fuse $4_2$ must be avoided. The enlarged radiation region 5A of the fuse $4_2$ is offset from the enlarged radiation region 5A of the fuse $4_1$ by the pitch P. Thus, margin in the radiation surface area arises by an amount corresponding to the pitch. In other words, the radiation surface area can be made large. Due to the radiation surface area made large, reliable fuse cut can be obtained, and direction control of laser beam can become easy. In FIG. 14, the memory cell region 20 and the like shown in FIG. 7, which do not directly relate to the description, are omitted.

The present invention is not limited to the disclosed embodiments, and other various embodiments can be provided. For example, one semiconductor device can be formed by combining the embodiment shown in FIG. 7 and the embodiment shown in FIG. 11. Namely, a certain fuse region can be the structure shown in FIG. 7, and another fuse region can be the structure shown in FIG. 11.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    an interlayer insulation film formed above the semiconductor substrate;
    a fuse arrangement including a plurality of fuses formed on or in the interlayer insulation film substantially parallel with each other to extend in a surface-extension direction of the semiconductor substrate; and
    a wiring layer arrangement including a plurality of wiring layers formed in the interlayer insulation film in the surface-extension direction of the semiconductor substrate and electrically isolated from the fuses, the wiring layers being provided under the fuses, the wiring layers having a width smaller than the fuses and not extending over a region overlapping with the fuses, and the wiring layer arrangement including no wiring layers in a region out of the region overlapping with the fuses.

2. A semiconductor device according to claim 1, in which the plurality of fuses and the plurality of wiring layers are arranged in the surface-extension direction of the semiconductor substrate, respectively, and the fuses and the wiring layers correspond to each other in one-to-one positional relationship.

3. A semiconductor device according to claim 1, in which at least one of the plurality of wiring layers has a multilayer structure including wiring layers arranged in a depth direction of the semiconductor substrate.

4. A semiconductor device according to claim 3, in which the plurality of the fuses and the plurality of wiring layers having the multilayer structures are arranged in the surface-extension direction of the semiconductor substrate, respectively, and the fuses and the wiring layers having the multilayer structures correspond to each other in one-to-one positional relationship.

5. A semiconductor device according to claim 1, in which a group of the wiring layers are arranged in a surface-extension direction of the semiconductor substrate, the wiring layers of the group being positioned under the fuse.

6. A semiconductor device according to claim 5, in which a plurality of the fuses and a plurality of the groups of the wiring layers are arranged in a surface-extension direction of the semiconductor substrate respectively, the fuses and the groups of the wiring layers correspond to each other in one-to-one positional relationship, and each of the groups of the wiring layers is positioned under a corresponding one of the fuses.

7. A semiconductor device according to claim 1, further comprising a control circuit connected to at least one of the wiring layers.

8. A semiconductor device according to claim 1, in which at least one of the wiring layers is a power source line or a signal line.

9. A semiconductor device according to claim 1, in which the fuses are selectively burned out with a laser radiation, and the following relations are satisfied:

$$\theta = \lambda/2nWf$$

where, $\theta$ is a width of diffraction of a laser beam,
$\lambda$ is a wavelength of the laser beam,
n is a refractive index of the interlayer insulation film, and
Wf is a width of the fuses, $$Wc \leq Wf - 2T\tan\theta$$

where, Wc is the width of the wiring layers, and
T is a distance between a bottom surface of the fuses and the upper surface of the wiring layers.

10. A semiconductor device according to claim 1, in which the plurality of fuses and the plurality of wiring layers have only the interlayer insulation film therebetween.

11. A semiconductor device comprising:
a semiconductor substrate;
an interlayer insulation film formed above the semiconductor substrate;
a fuse arrangement including a plurality of fuses formed on or in the interlayer insulation film substantially parallel with each other to extend in a surface-extension direction of the semiconductor substrate; and
a wiring layer arrangement including a plurality of wiring layers formed in the interlayer insulation film in the surface-extension direction of the semiconductor substrate, the wiring layers being provided under the fuses, the wiring layers having a width smaller than the fuses and not extending over a region overlapping with the fuses, the wiring layers and the fuses having no via-contacts coupling the wiring layers and the fuses to each other, and the wiring layer arrangement including no wiring layers in a region out of the region overlapping with the fuses.

12. The semiconductor device according to claim 11, further comprising:
a control circuit connected to at least one of the wiring layers.

13. The semiconductor device according to claim 11, wherein: at least one of the wiring layers is a power source line or a signal line.

14. The semiconductor device according to claim 11, wherein:
the fuses are selectively burned out with a laser radiation, and the following relations are satisfied:

$$\theta = \lambda/2nWf$$

where, $\theta$ is a width of diffraction of a laser beam,
$\lambda$ is a wavelength of the laser beam,
n is a refractive index of the interlayer insulation film, and
Wf is a width of the fuses, $$Wc \leq Wf - 2T\tan\theta$$

where, Wc is the width of the wiring layers, and
T is a distance between a bottom surface of the fuses and the upper surface of the wiring layers.

* * * * *